United States Patent
Lee

(10) Patent No.: US 7,067,364 B1
(45) Date of Patent: Jun. 27, 2006

(54) GATE STRUCTURES HAVING SIDEWALL SPACERS USING SELECTIVE DEPOSITION AND METHOD OF FORMING THE SAME

(75) Inventor: Shih-Ked Lee, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 83 days.

(21) Appl. No.: 10/808,951

(22) Filed: Mar. 25, 2004

Related U.S. Application Data

(63) Continuation-in-part of application No. 09/927,604, filed on Aug. 10, 2001, now Pat. No. 6,740,549.

(51) Int. Cl.
*H01L 21/8234* (2006.01)

(52) U.S. Cl. .................. 438/197; 438/199; 438/216

(58) Field of Classification Search .......... 438/197, 438/199, 216, 265, 275, 585, 586, 591, 595, 438/902

See application file for complete search history.

(56) References Cited

U.S. PATENT DOCUMENTS

| | | | |
|---|---|---|---|
| 4,981,810 A * | 1/1991 | Fazan et al. ........... 438/305 |
| 5,731,236 A * | 3/1998 | Chou et al. ........... 438/253 |
| 6,001,719 A * | 12/1999 | Cho et al. ............. 438/592 |
| 6,281,084 B1* | 8/2001 | Akatsu et al. ......... 438/301 |
| 6,335,279 B1* | 1/2002 | Jung et al. ............. 438/666 |
| 6,486,506 B1* | 11/2002 | Park et al. ............. 257/314 |
| 6,566,236 B1* | 5/2003 | Syau et al. ............. 438/585 |
| 6,740,549 B1* | 5/2004 | Chen et al. ............. 438/197 |

* cited by examiner

*Primary Examiner*—George Fourson
*Assistant Examiner*—Fernando L. Toledo
(74) *Attorney, Agent, or Firm*—Glass & Associates

(57) ABSTRACT

Gate stacks with sidewall spacers having improved profiles to suppress or eliminate void formation between the gate stacks during gap-filling is disclosed, along with a method of forming the gate structures over a semiconductor substrate. A gate dielectric layer is formed on a semiconductor substrate. Then, a gate stack 24 having a sidewall is formed over the gate dielectric layer. The gate stack 24 comprises a conductive layer 28 and a hard mask 30 overlying the conductive layer 28. A liner 32 is selectively deposited over the gate stack 24 such that the liner 32 is deposited on the hard mask 30 at a rate lower than the rate of deposition on the conductive layer 28. Thus, the liner 32 is substantially thinner on the hard mask 30 than on the conductive layer 28. A nitride spacer is formed over 34 the liner 32. A PMD layer is formed over the resultant structure, filling the gaps between adjacent gate stacks and substantially free of voids.

10 Claims, 2 Drawing Sheets

GATE STRUCTURES HAVING SIDEWALL SPACERS USING SELECTIVE DEPOSITION AND METHOD OF FORMING THE SAME

CROSS-REFERENCE TO RELATED APPLICATIONS

This application is a continuation in part of application Ser. No. 09/927,604, entitled "GATE STRUCTURES HAVING SIDEWALL SPACERS USING SELECTIVE DEPOSITION AND METHOD OF FORMING THE SAME," by Chih-Hsiang Chen, Guo-Quiang Lo and Shih-Ked Lee, filed on Aug. 10, 2001, now U.S. Pat. No. 6,740,549 which is incorporated herein by reference.

BACKGROUND OF THE INVENTION

1. Field of the Invention

This invention relates generally to semiconductor devices and, more particularly, to a semiconductor device having sidewall spacers and method of manufacturing thereof.

2. Description of the Related Art

SAC (self-aligned contact) technology has been utilized to form self-aligned contact holes between closely spaced gate stacks to accommodate ever-increasing density in ULSI (ultra large scale integration) circuits.

The SAC technology uses a selective etching process to form contact holes. In this technology, as shown in FIG. 1, a capping layer 10 and a pre-metal dielectric (PMD) layer 12 are deposited over a gate electrode 14, thereby forming closely-spaced gate stacks 16. Nitride sidewall spacers 15 are typically formed along opposite sides of the gate stacks 16. The selective etch process is designed to remove material from the PMD layer 12 faster than it removes material from the capping layer 10 or the sidewall spacers 15. Nitrides and oxides are typically used for the capping and PMD layers 10, 12, respectively.

However, with this SAC structure, filling the narrow gaps between the gate stacks 16 is very difficult with conventional semiconductor fabrication technologies, especially when the aspect ratio is high as is the case for state-of-the art semiconductor devices. Thus, as shown in FIG. 1, undesirable voids 18 can be formed between the gate stacks 16 during the deposition of the PMD layers 12. This has been a serious problem because adjacent contact holes can be connected through the voids 18. Thus, shorts between contact fillings (plugs) can occur unintentionally, causing device failures.

Such a problem has been recognized by the semiconductor industry, for example, as disclosed in U.S. Pat. No. 5,789,314, field on Dec. 5, 1995 and issued on Aug. 4, 1998 to Integrated Device Technology, Inc., Santa Clara. Calif. U.S. Pat. No. 5,789,314 discloses suppressing or eliminating void formation during the manufacture of integrated circuits by overlying conductive lines with an oxide layer and removing a portion of the oxide layer to create recesses at regular intervals between the conductive lines. However, such attempt has not been entirely successful as integration density increases as described above.

Accordingly, a need remains for forming gate stack structures having sidewall spacers that enable sufficient gap filling by a dielectric without forming voids therebetween.

SUMMARY OF THE INVENTION

Gate structures with sidewall spacers having improved profiles to suppress or eliminate void formation between the gate structures during gap-filling are disclosed, along with a method of forming the gate structures over a semiconductor substrate.

In accordance with one aspect of the present invention, a gate dielectric layer is formed on a semiconductor substrate. Then, a multi-layer gate stack having a sidewall is formed over the gate dielectric layer. The gate stack comprises a conductive layer and a hard mask overlying the conductive layer. A liner is selectively deposited over the gate stack such that the liner is deposited on the hard mask at a rate lower than the rate of deposition on the conductive layer. Thus, the liner is substantially thinner on the hard mask than on the conductive layer. A sidewall spacer is formed over the liner.

When two gate stacks are spaced closely together, the method of the invention enables filling the intervening gap without forming voids between the gate stacks.

The foregoing and other objects, features and advantages of the invention will become more readily apparent from the following detailed description of a preferred embodiment of the invention that proceeds with reference to the accompanying drawings.

DETAILED DESCRIPTION

Figure 2:
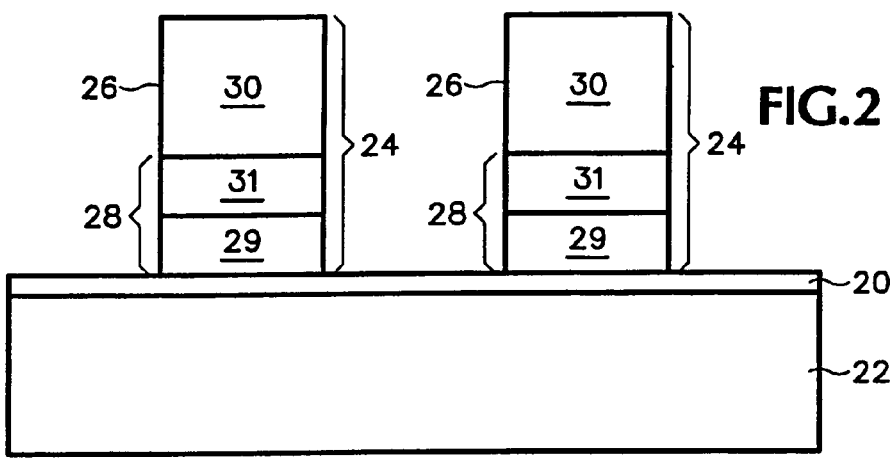
FIGS. 2–4 are cross-sectional views of a semiconductor device at progressive stages of fabrication in accordance with one embodiment of the present invention.
Figure 3:
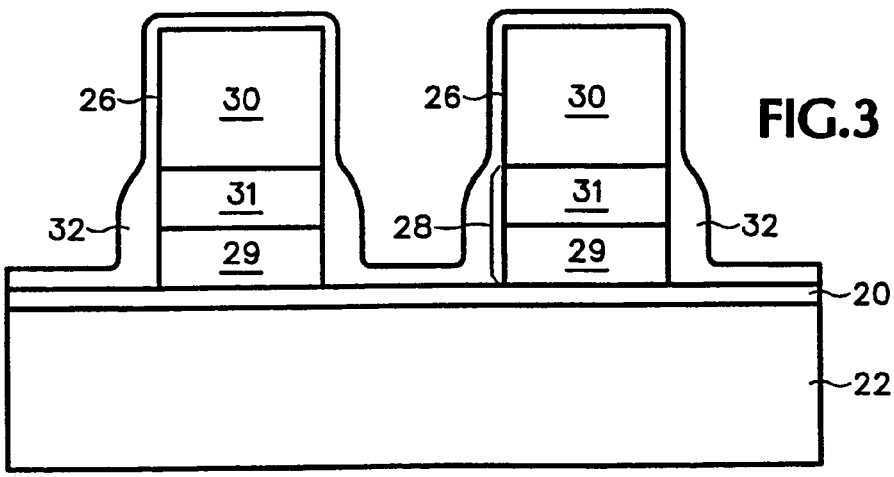
Figure 4:
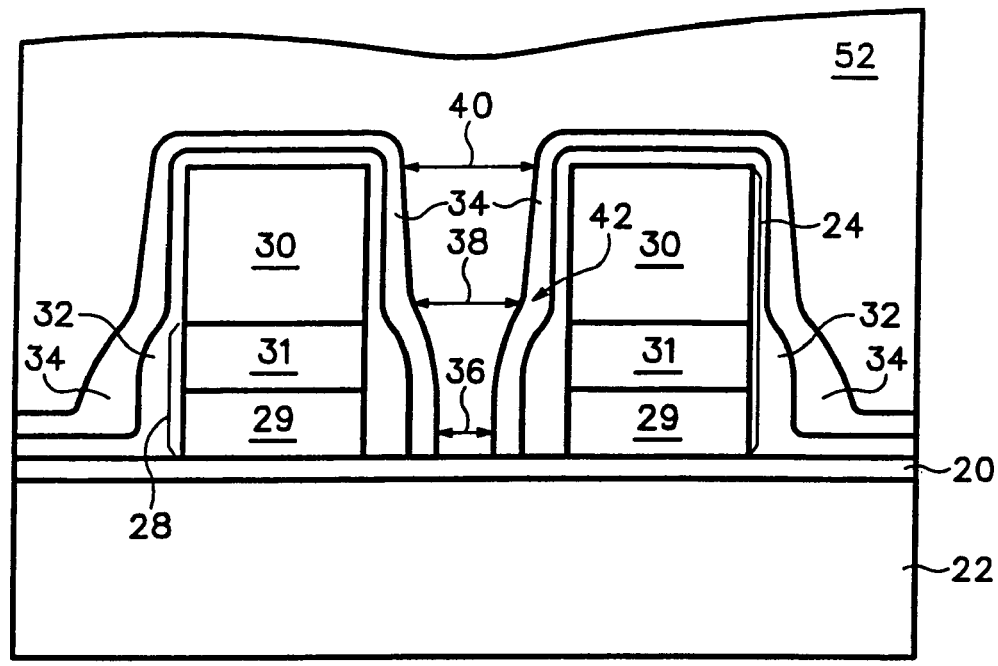

FIGS. 2–4 illustrate the preferred embodiment of the present invention to suppress or eliminate voids between gate structures. This invention may be embodied in different forms and should not be construed as limited to the embodiment set forth herein. Well-known process steps such as forming a gate dielectric have not been described in detail in order not to obscure the present invention.

As shown in FIG. 2, a gate dielectric 20 with a thickness of 25–80 Angstroms is formed on a semiconductor substrate 22 such as a silicon substrate.

Then, two or more adjacent multi-layer gate stacks 24 (only two of which is shown) are formed overlying the gate dielectric 20 using conventional techniques CVD (chemical vapor deposition). The gate stacks 24 have sidewalls 26 that oppose each other across the gap as illustrated.

The multi-layer gate stacks 24 each comprise a conductive layer 28 and a hard mask 30 overlying the conductive layer 28. The surface characteristics of the conductive layer 28 and the hard mask 30 are different such that selective deposition thereon can be achieved using appropriate deposition methods. The conductive layer 28 can include a doped polysilicon layer 29, and a silicide layer 31 such as a $WSi_x$ layer. In particular, the doped polysilicon layer 29 is formed to a thickness of 500–2000 Angstroms on the gate dielectric 20. The silicide layer 31 is formed to a thickness of 400–1500 Angstroms on the doped polysilicon layer 29. However, a person skilled in the art will appreciate that the conductive layer 28 can also comprises a metal to form a metal gate.

The hard mask 30 is formed on the conductive layer 28 to a thickness of 1000–2500 Angstroms. Preferably, the hard mask 30 is formed of SiON, nitride or combinations thereof, using conventional techniques. However, the hard mask 30 can be formed with any other suitable materials, other than nitride or SiON, which allows selective deposition with respect to the conductive layer 28.

In one embodiment hard mask 30 is a capping nitride layer that is a single layer of nitride material. Alternatively, hard mask 30 can be a single layer of silicon oxynitride ($S_jO_xN_y$, and/or $Si_2O_2N$) or a single layer of oxide. In one embodiment hard mask 30 is a multi-layer structure that includes one or more layers of nitride and/or one or more layers of oxide and/or one or more layers of silicon oxynitride.

Referring to FIG. 3, a liner 32 is selectively deposited over the gate stacks 24 such that the liner 32 is deposited on the hard mask 30 at a rate lower than the rate of deposition on the conductive layer 28. Accordingly, the liner 32 is formed substantially thinner on the hard mask 30 than on the conductive layer 28. Preferably, to achieve this structure, the liner 32 is formed of oxide and is deposited by APCVD (atmospheric pressure chemical vapor deposition) or SACVD (sub-atmospheric pressure chemical vapor deposition) methods.

With such selective deposition methods, deposition rates are different depending on the surface characteristics of the area to be deposited. Such selective deposition can be controlled by adequate pressure, temperature, and $O_3$ concentration to achieve desired sidewall spacer profiles.

Also, other deposition methods that enable selective deposition depending on the surface characteristics of the multi-layer gate stack 24 can be used within the spirit and scope of the present invention.

Accordingly, the liner 32 is deposited on the hard mask 30 and the conductive layer 28 at different rates, depositing substantially more on the conductive layer 28 than on the hard mask 30. Preferably, the liner 32 is deposited on the hard mask 30 at a rate approximately one-fifth the rate of deposition on the conductive layer 28. In one embodiment liner 32 is deposited selectively on conductive layer 28 in a thickness at least twice the thickness of that portion of liner 32 that is deposited on hard mask 30.

Figure 1:
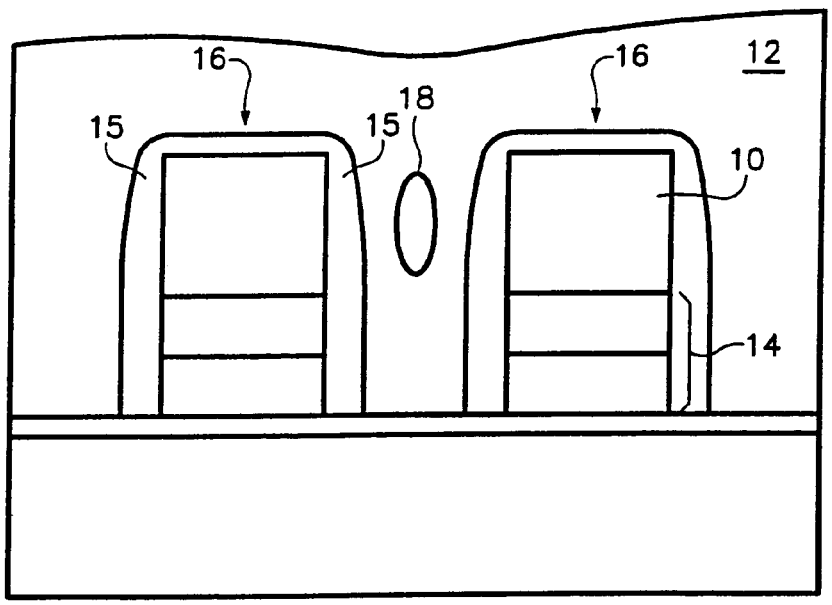
FIG. 1 is a cross-sectional view of the conventional self-aligned contact structure.

Consequently, the shape or profile of the liner 32 can make the profile of the sidewall spacer, which is to be formed sequentially thereon, less outward-sloped toward the bottom or base of the gate stacks 24 than that of conventional technologies (See FIG. 1). In other words, with such a profile of the underlying liner 32, sidewall spacer thickness variation, i.e. the shape of thin top and substantially thicker bottom, is made possible.

Turning to FIG. 4, adjacent sidewall spacers 34 are formed on the liner 32 using conventional techniques. In particular, a layer of nitride spacer material is deposited conformally over the liner 32. The layer of nitride spacer material can be also formed with other suitable insulation materials within the spirit and scope of the present invention. Subsequently, the layer of nitride spacer material can be etched back to form the spacers 34 as illustrated in FIG. 4. Consequently, the sidewall spacers 34 each overlie the opposing sidewalls 26, thereby forming at least two opposing sidewall spacers 34.

According to one embodiment of the present invention, the at least two adjacent opposing sidewall spacers 34 have a bottom, middle, and top space 36, 38 and 40 therebetween. Preferably, the bottom space 36 is substantially narrower than the middle space 38 and space 40 is at least as wide and preferably wider than space 38.

According to another embodiment of the present invention, the sidewall spacers can have a transition 42 adjacent a boundary between the conductive layer 28 and the hard mask 30.

Subsequently, as is known in the art, an etch stop layer (not shown) can be formed overlying the gate stacks 24 with sidewall spacers 34 prior to depositing a pre-metal dielectric (PMD) layer or an interlevel dielectric layer. The etch stop layer can be formed of a material selected from the group consisting of nitride, SiON, oxide and combinations thereof.

Next, a PMD layer 52 is deposited on the etch stop layer 50 overlying the gate stacks 24 with opposing sidewall spacers 34. Particularly, to form the PMD layer 50, an insulating layer, formed of a material such as a BPTEOS film, is deposited and planarized using conventional techniques, such as chemical mechanical polishing (CMP).

Because the profiles of the sidewall spacers 34 are less sloped than conventional structures, especially at the base of the gate stacks 24, the spaces (gap) 36, 38 and 40 between the gate stacks 24 can be filled with the PMD layer 52 without void formation. This is believed to be possible even with the gate structures having an aspect ratio of 8:1. At such an aspect ratio, the gap filling capability is strongly dependent upon the profile of the sidewall space profile. The less sloped the sidewall is, the easier the gap filling can be. However, it has not been easy to control the spacer profile by convention techniques using etching.

With the present invention, however, the less sloped sidewall spacer profile could be formed effectively, using selective deposition of the liner 32 on multi-layer gate stacks 24, of which layer 28 has surface characteristics different from those of hard mask 30, which difference allows selective deposition.

Then, although not shown, as known in the art, a photoresist layer is deposited and patterned to form a photoresist pattern exposing a portion of the PMD layer 52 to define a contact hole. Then, the underlying PMD layer 52 is etched to form a contact hole 51 in the PMD layer 52.

Figure 5:
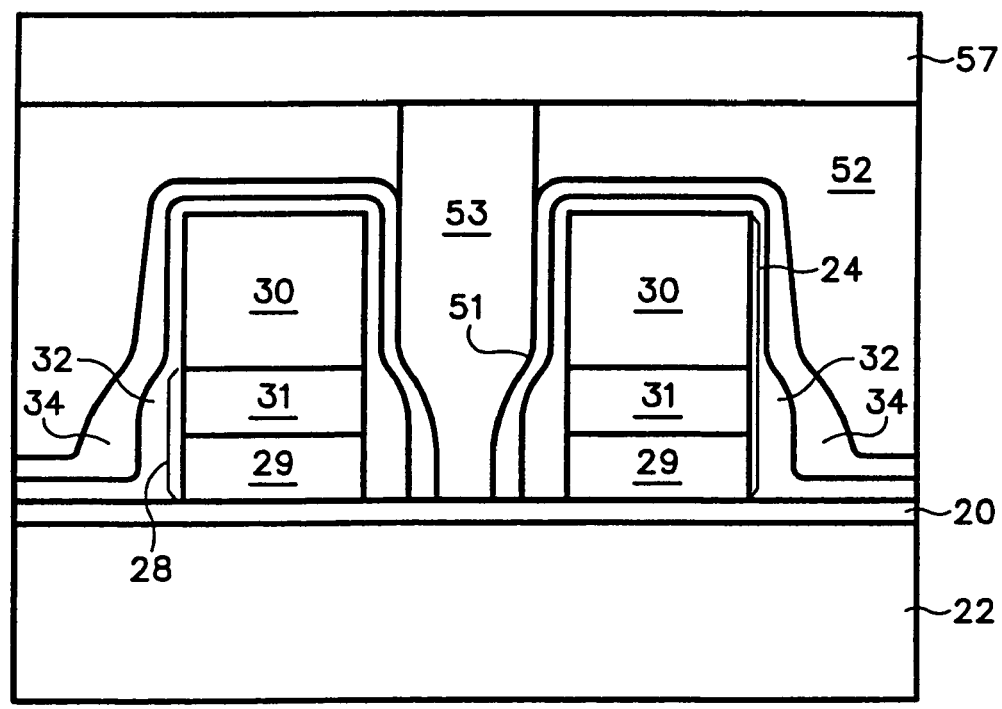
FIG. 5 is a cross-sectional view of a completed device in accordance with the present invention.

Subsequently, as shown in FIG. 5, metallization steps such as the formation of a contact plug 53 and a conductive line 57 overlying the contact plug 53 are performed using conventional techniques.

Because voids between the gate stacks 24 or gate structures can be substantially eliminated or suppressed with the present invention less-sloped at the bottom sidewall spacer structures, self-aligned contact holes can be advantageously prevented from being electrically connected through the voids, reducing the risk of forming shorts between the contact plugs and the gate stacks 24 during the metallization steps.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A method of manufacturing a semiconductor device on a semiconductor substrate, comprising:
   forming a gate dielectric on the semiconductor substrate;
   forming a gate stack overlying the gate dielectric, the gate stack having a sidewall,
   wherein the gate stack comprises a conductive layer and a hard mask overlying the conductive layer;
   selectively depositing a liner over the gate stack such that the liner is deposited on the hard mask at a rate lower than the rate of deposition on the conductive layer, so that the liner is thinner on the hard mask than on the conductive layer; and
   forming a nitride spacer over the liner.

2. The method of claim 1, wherein said forming a nitride spacer comprises:
   forming a layer of nitride spacer material conformally over the liner; and
   etching back the layer of nitride spacer material.

3. The method of claim 1, wherein the liner is deposited on the hard mask at a rate approximately one-fifth the rate of deposition on the conductive layer.

4. The method of claim 1, wherein the liner is deposited selectively on the conductive layer in a thickness at least twice a thickness of deposition on the hard mask.

5. The method of claim 1, wherein said liner is formed of oxide.

6. A method of manufacturing a semiconductor device on a semiconductor substrate, comprising:
   forming at least two adjacent gate stacks over the substrate, the adjacent gate stacks each having a sidewall opposing each other,
   wherein each of the gate stacks comprises a conductive layer and a hard mask overlying the conductive layer;
   selectively depositing a liner over the gate stacks, so that the liner is thicker on the conductive layer than on the hard mask; and
   forming adjacent at least two nitride spacers on the liner, overlying the opposing sidewalls,
   wherein the liner is deposited over the hard mask at a rate lower than the rate of deposition on the conductive layer.

7. The method of claim 6, wherein the liner is deposited on the hard mask at a rate approximately one-fifth the rate of deposition on the conductive layer.

8. The method of claim 6, wherein the liner is deposited selectively on the conductive layer in a thickness at least twice a thickness of deposition on the hard mask.

9. The method of claim 6, wherein said forming adjacent nitride spacers comprises:
   forming a layer of nitride spacer material conformally over the liner, and etching back the layer of nitride spacer material.

10. The method of claim 6, wherein the adjacent nitride spacers have top, middle, and bottom spaces therebetween, and wherein the bottom space is substantially shorter than the middle space.

* * * * *